United States Patent [19]

Savagian et al.

[11] Patent Number: 5,001,605

[45] Date of Patent: Mar. 19, 1991

[54] MULTILAYER PRINTED WIRING BOARD WITH SINGLE LAYER VIAS

[75] Inventors: Peter J. Savagian, Redondo Beach; Thomas E. Fitzhugh, Lomita, both of Calif.

[73] Assignee: Hughes Aircraft Company, Los Angeles, Calif.

[21] Appl. No.: 278,115

[22] Filed: Nov. 30, 1988

[51] Int. Cl.$^5$ .................................................. H05K 1/11
[52] U.S. Cl. ...................................... 361/414; 174/266
[58] Field of Search ................ 361/410, 414; 174/262, 174/266

[56] References Cited

U.S. PATENT DOCUMENTS 4,150,421 4/1979 Nishihara et al. .................... 361/410
4,325,780 4/1982 Schulz, Sr. ....................... 174/266 X
4,434,321 2/1984 Betts ................................ 174/266 X
4,785,141 11/1988 Nishihara et al. .................... 361/414

Primary Examiner—Leo P. Picard
Assistant Examiner—Paramita Ghosh
Attorney, Agent, or Firm—Leonard A. Alkov; W. K. Denson-Low

[57] ABSTRACT

The top board (12) in multi-layer printed wiring board (10) has a conductor (48) on its underside leading from the principal via (20) to small via (54). The small via is filled with resin material so that it is plated level over with copper layer (62) and solder layer (64). When leadless chip carrier (66) is attached, there is no place for the solder layer (64) to run to starve the joint to result in reliable solder attachment.

8 Claims, 2 Drawing Sheets

MULTILAYER PRINTED WIRING BOARD WITH SINGLE LAYER VIAS

FIELD OF THE INVENTION

This invention is directed to printed wiring boards and particularly multiple layer printed wiring boards which are provided with only a single layer via under a mounting pad for a leadless chip carrier to prevent solder starvation by solder running down a via upon solder reflowing.

BACKGROUND OF THE INVENTION

Printed wiring boards have conductors of conductive metal extending from one pad to another so that components can be mounted on the printed wiring board and connected to the pad to provide complex, extensive interconnections without the expense and chance of error in individual wiring. Single layer printed wiring boards are well known but suffer from the problem of crossing conductors. In order to overcome the crossover problem, multi-layer printed wiring boards are provided. These multi-layer printed wiring boards have conductors on plural layers. Interconnections between layers are provided by vias. The vias are in the form of holes through the boards. The holes are plated to make contact with the printed wiring on each of the appropriate layers.

Pads are provided on the conductors so that connection can be made to the components. These pads are commonly coated with solder and connections are made by reflow of the solder. When the component pad or lead is in contact with the pad on the printed wiring board, sufficient heat is applied to melt the solder on the pad so that it reflows into a connection with the component. The component may be connected by means of a lead frame on a package, individual wiring, or by placement of a leadless chip carrier with its pads directly in contact with the pads on the printed wiring board.

When such a pad is adjacent a via, reflow heating of the solder on the pad on the printed wiring board may permit the solder to run through the adjacent via. Such would starve the joint and would produce molten solder on the backside of the printed wiring board adjacent the via opening. Both are undesirable and should be eliminated.

Excess solder on the pad to accommodate for such outflow reduces control of the solder pad height, and thus is an undesirable adjunct of the prior practice. In addition, it is present practice to make the solder pads on the printed wiring board of greater length than the solder pad on the leadless chip carrier because this greater length is required to place the via outside the periphery of the leadless chip carrier. When the via is eliminated, the leadless chip carrier mounting pads on the printed wiring board need only extend to the periphery of the leadless chip carrier, which is termed zero-extension style pad patterns. Zero-extension style leadless chip carrier pad patterns may be less solder-height sensitive for good quality solder joints and are expected to allow for automated solder joint inspection and increased component spacing density.

SUMMARY OF THE INVENTION

In order to aid in the understanding of this invention, it can be stated in essentially summary form that it is directed to a multi-layer printed wiring board with single layer vias wherein mounting pads on the top surface of the multi-layer board are connected by vias which extend only through the top board layer so as to eliminate large, long vias which accept a large volume of solder upon reflow solder heating.

It is thus a purpose and advantage of this invention to provide a multi-layer printed wiring board which is configured so that pads thereon do not lose their solder through large adjacent multi-layer vias.

It is another purpose and advantage of this invention to provide a multi-layer printed wiring board wherein solder runs through the vias and backside solder masking are eliminated by separating solder pads from the vias.

It is a further purpose and advantage of this invention to provide a printed wiring board on which the solder layer is electroplated to achieve better pad and conductor height control, and better pad and conductor geometry is achieved by eliminating external circuit connections between pads and vias.

It is another purpose and advantage of this invention to provide a multi-layer printed wiring board structure which provides good solder height control on solder pads on the board by preventing molten solder from flowing along a conductor to a via which has a through-plated hole.

It is another purpose and advantage of this invention to provide a multi-layer printed wiring board wherein pads thereon can be configured so that they do not extend beyond the periphery of leadless chip carriers, by isolating the pads so they do not have laterally attached surface conductors, to achieve optimum attachment to corresponding pads on a leadless chip carrier without resulting in a partial solder fillet which would occur between the leadless chip carrier and a surface conductor.

Other purposes and advantages of this invention will become apparent from a study of the following portion of this specification, the claims and the attached drawings wherein:

DESCRIPTION OF THE PREFERRED EMBODIMENT

Figure 2:
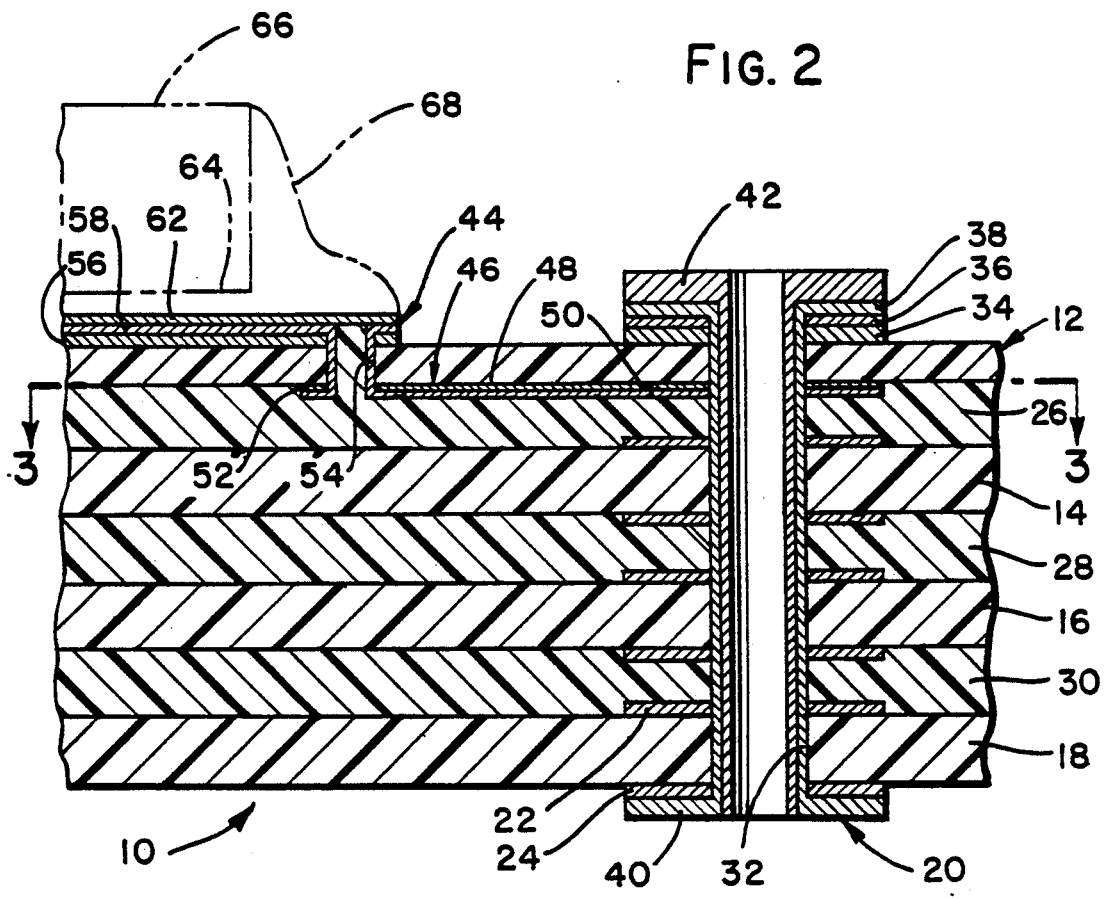
FIG. 2 is an enlarged section therethrough taken generally along the line 2—2 of FIG. 1.

FIG. 2 illustrates a multi-layer printed wiring board generally indicated at 10. The printed wiring board 10 is of conventional construction. Board layers 12, 14, 16 and 18 are fiber-reinforced organic boards with circuit conductors on both the upper and lower sides thereof. The circuit conductors are arranged to achieve a complex interconnection problem. In conventional practice, the dielectric circuit boards have a copper layer laminated on each face thereof. These layers are provided with a photosensitive mask, are exposed and then etched to provide the circuit conductors. The only portions of the circuit conductors shown on boards 14, 16 and 18 are pads at via 20. Pads 22 and 24 are shown on circuit board 18, and similar pads are provided on the upper boards. After the conductors and pads are prepared, the boards 12, 14, 16 and 18 are laminated into a single board. Mats 26, 28 and 30 are pre-impregnated with a thermosetting resin and are laid between the boards as indicated. These mats are called "pre-preg" in the trade because they are impregnated with the thermosetting resin before use. When assembled in this manner and compressed in a jig, oven curing of the thermosetting pre-pregs is accomplished. This results in the basic multi-layer printed wiring board 10. Thereupon, the via 20 is produced by first drilling through the multi-layer board to produce via hole 32. The via hole 32 passes through pad 24 on the bottom and pad 34 on the top. Next, copper layer 36 is plated on the top surface on clad layer 34. Next, the copper layer 38 is plated through the hole 20 to also form a backside copper plate layer 40 on pad 24. As a last step in the via processing, solder layer 42 is plated on the top of layer 28 and on the layer 38 where it passes through the via. This completes the via.

It is seen that, if the layers 34, 36, 38 and 40 on the top of the multi-layer printed wiring board were directly attached to a solder pad, fluid solder could run down the interior of the via to starve the joint and hang out of the bottom of the via holes to form icicles. To prevent the icicles, backside solder masking has been employed, but there has been no successful procedure by which the solder was prevented from running into the vias to starve the joint.

Figure 1:
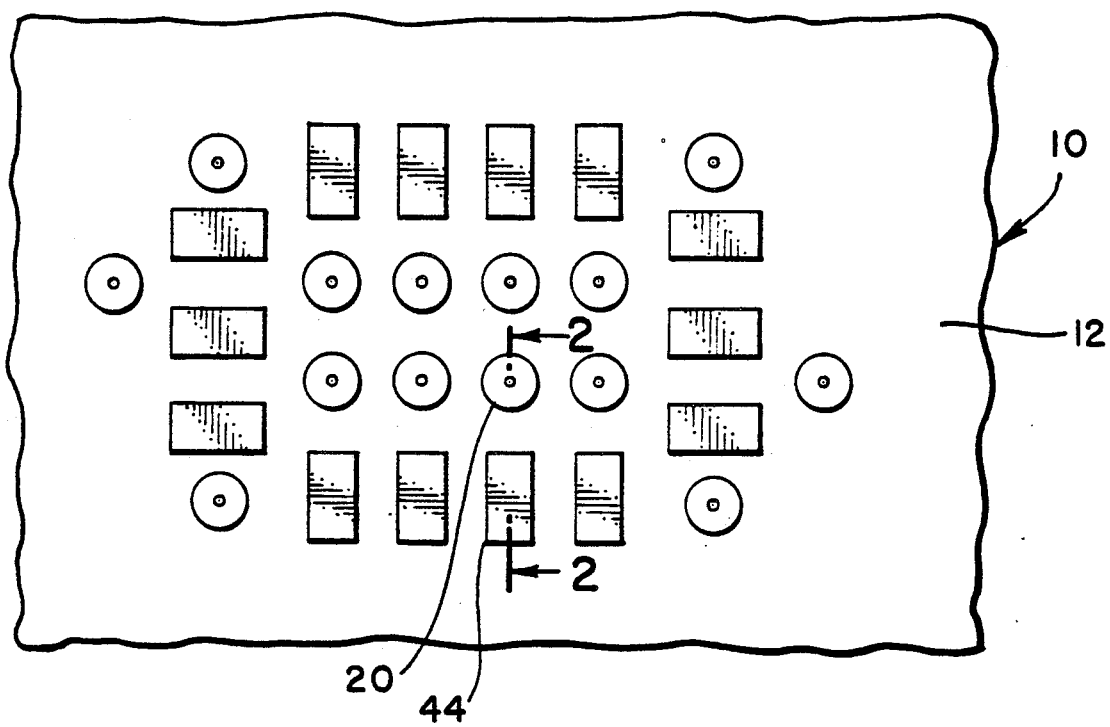
FIG. 1 is a plan view of a portion of a multi-layer printed wiring board in accordance with this invention.
Figure 3:
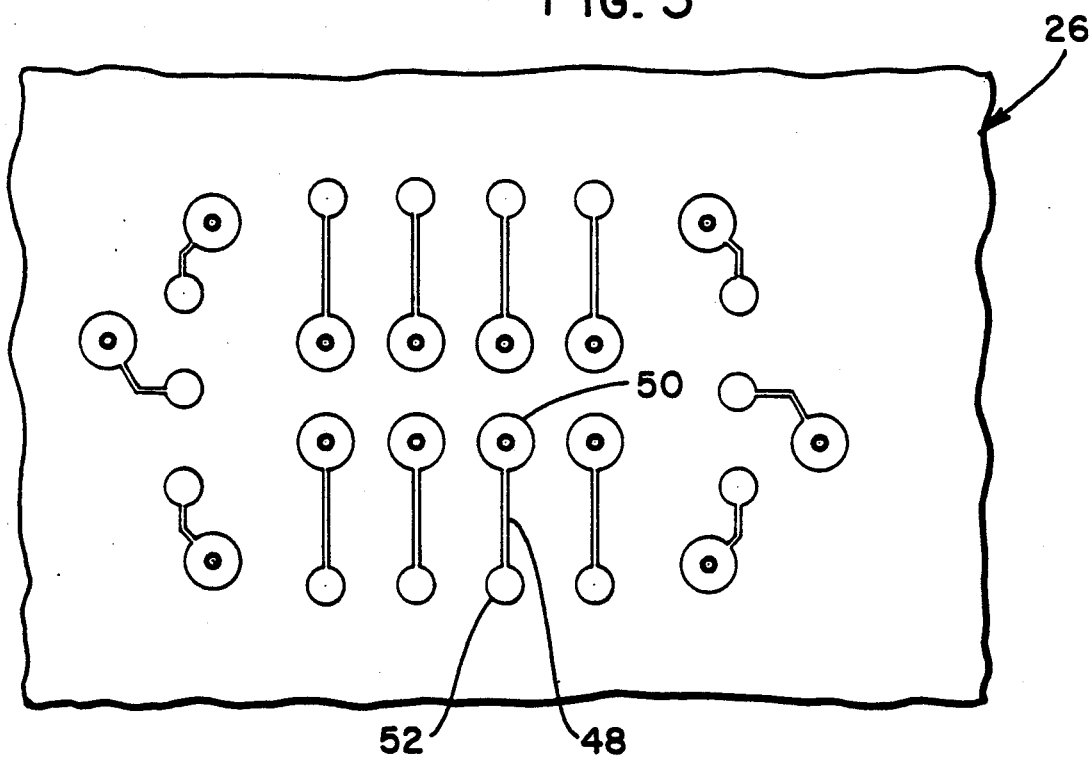
FIG. 3 is a plan view, on the same scale as FIG. 1, showing the conductors on the underside of the top layer of the multi-layer printed wiring board, as seen generally along the line 3—3 of FIG. 2.

It is the provision of a separate mounting pad, away from the vias, as disclosed herein, which prevents the starvation of the solder joint by separating the pad from the via. In FIG. 1, a plurality of pads is shown in rectangular configuration for the positioning directly thereon of a leadless chip carrier. Pad 44 is shown in association with the via 20. While a rectangular arrangement of the pads is illustrated for direct attachment of a leadless chip carrier, as mentioned above, the pads can be arranged in facing parallel rows for the attachment of lead frames of flat packs. Other arrangements are also possible depending upon the component which is to be attached at the pads. FIG. 3 is a downwardly looking view showing the top of pre-preg layer 26, but the section is taken at the bottom of the board 12 above its clad layer to show the conductors and pads on the bottom of the board layer 12, to show them in corresponding position to the pads on the top of the board layer 12.

Figure 4:
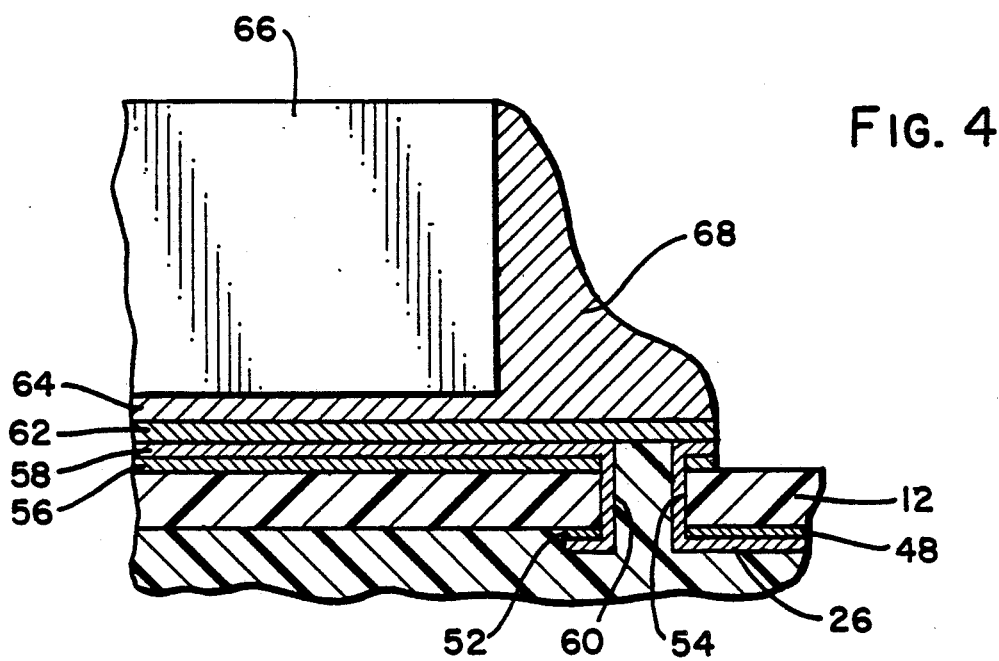
FIG. 4 is a further enlarged section showing a section through one of the top layer pads, with a leadless chip carrier mounted thereon, with parts broken away.

The clad layer 46 on the under side of board 12 is etched to leave conductor 48 as well as large via pad 50 and small via pad 52. Small via hole 54 is drilled through board layer 12 prior to the assembly of the multi-layer printed wiring board. The small via hole 54 is drilled through the small via pad 52 and through the top clad layer on the board 12 where it forms mounting pad 56. After this etching of the clad layers on the bottom side of the board 12 and drilling of the small via hole 54, the copper plate layer, which produced copper layer 36, is also plated onto conductor 48, pad 50, pad 52 and pad 56. In FIG. 2, the copper plate layer on the mounting pad 56 is indicated at 58, and it is this layer which through-plates the small via hole 54 to become via connector 60 (see FIG. 4). The copper plate extends across the lower surface of the pads 50 and 52 as well as conductor 48. It is in this stage that the individual boards are laminated with pre-pregs to form the multi-layer printed wiring board 10. In FIGS. 2 and 4, it is seen that the pre-preg layer 26 extrudes up into and preferably fills the hole through via connector 60. This closes the opening from above. After this assembly, the via 20 is formed as described above, and it is during this processing that the copper plate layer 62 is formed. The copper plate layer extends directly across the via opening 60, as best seen in FIG. 4. Next, the solder plate layer 42 is applied, and this produces pad solder layer 64, which completes the pad 44. It is thus seen that, when the solder layer 64 is melted for reflow, it cannot run a way along a conductor or down a via because none are directly connected therethrough, as seen in FIG. 1. In FIG. 1, each of the vias is separate from its associated pad. The relationship of the vias and pads is indicated in FIG. 3, although it is understood that the layouts of FIGS. 1 and 3 are merely illustrative.

FIG. 4 illustrates the multi-layer printed wiring board 10 after a leadless chip carrier 66 has been positioned thereon and soldered in place by reflow soldering. Leadless chip carrier 66 has solder wettable pads on its bottom and may have extensions of those pads up the end of the leadless chip carrier. The leadless chip carrier is positioned so that its pads overlie the pads on the printed wiring board and the assembly is subjected to soldering temperature, such as by vapor phase soldering. When the solder is melted, it flows to wet the contact pads on the leadless chip carrier. When the leadless chip carrier has a contact pad extending up the end and the chip carrier is of smaller dimension than the outline of the group of pads on the printed wiring board, a fillet is formed. Fillet 68 is illustrated in FIG. 4. The fillet extends the electrical contact area and is visually inspectable. In another situation, the leadless chip carrier may only have contact pads on the bottom, not extending up the sides. In such a case, the edge of the leadless chip carrier would preferably be in line with the outer edge of the set of pads. In such a case, the right end of the leadless chip carrier 66 would be even with the right end of the pad 44. In that case, no fillet would be formed, but solder attachment would be between the pad on a printed wiring board and the pad on the leadless chip carrier directly above. This system where the pads on the board do not extend beyond the periphery of the leadless chip carrier provides a system which is less solder height sensitive and also allows for automated solder joint inspection.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A multi-layer printed wiring board with a top surface of a top board layer comprising:
   at least first and second layers, said first and second layers having an interface therebetween, said first layer being a printed wiring board having an etched copper clad layer thereon defining a via top pad and a mounting top pad, said via top pad and said mounting top pad being physically separated on said top surface of said top board layer wherein said first layer is a fiber-filled thermosetting synthetic polymer composition material board and there is a third layer beneath said second layer and in contact therewith and said third layer is a fiber-filled thermosetting synthetic polymer composition material board and said second layer is a fiber-reinforced thermosetting synthetic polymer composition material which is unset when said boards are assembled and is thermoset with said boards in assembled condition so that thermosetting synthetic polymer composition material extends into said second via hole before thermosetting of the polymer composition material in said layer;

a first via pad in said interface between said first and second layers below said via top pad and a second via pad in said interface between said first and second layers below said mounting pad;

a first via hole through said via pad on said top surface and said first via pad in said interface, said first via hole extending through said multilayer printed wiring board including said first and second layers thereof, a conductor in said first via hole to interconnect said top via pad and said first via pad in said interface;

a second via hole between said mounting pad on said top surface and said second via pad in said interface, a conductive coating through said second via hole to connect said mounting pad and said second via pad; and an electrical conductor in said interface interconnecting said first via pad and said second via pad in said interface so that said top via pad is interconnected with said mounting pad without electrical interconnection along said top surface of said first layer.

2. The multi-layer printed wiring board of claim 1 wherein said first layer has clad copper on both the upper and lower surface thereof and said first and second via pads and said conductor connecting said first and second via pads in said interface are formed on the lower copper clad layer of said first layer.

3. The multi-layer printed wiring board of claim 2 wherein subsequent to forming pads and conductors in said clad layers, said clad layer on the top surface of said first layer has copper plated thereon to cover said second via and has solder deposited thereon to permit solder attachment to said mounting pad.

4. The multi-layer printed wiring board of claim 3 wherein there is a plurality of mounting pads on said top surface of said first layer and there is a plurality of vias extending through said multi-layer printed wiring board, at least some of said mounting pad being connected to a corresponding via in said interface between said first and second layers.

5. The multi-layer printed wiring board of claim 4 further including in combination a leadless chip carrier mounted so as to be secured and electrically connected by said solder layer on said pads.

6. A multi-layer printed wiring board comprising:

a plurality of layers, said plurality of layers including first, second and third layers, said first and third layers each having an upper and lower surface, said upper and lower surfaces of said first and third layers each having clad layer thereon and said clad copper on said upper surface of said first layer having via pads and mounting pads thereon, said lower surface of said first layer and said upper surface of said third layer having via pads and conductors thereon;

said second layer being formed of unset thermosetting synthetic polymer composition material in reinforcing fiber;

a first via hole through all of said layers of said multi-layer printed wiring board and a second via hole through only said first layer of said printed wiring board, said first via hole extending through a plurality of via pads and including a via pad on said upper surface of said first layer and through a via pad on said lower surface of said first layer;

a second via hole extending through a mounting pad on the top surface of said first layer and through a second via pad on said lower surface of said first layer;

a circuit conductor in said clad layer on said lower surface of said first layer extending between said first via hole and said second via pad, a conductive coating through both said via openings so that said conductive coating interconnects all pads in said opening through said multi-layer printed wiring board and a conductive coating connects said mounting pad and said via pad, said second layer extending up into said second via hole to at least partially fill said second via hole; and solder deposited on said mounting pad, said mounting pad being separated from said via so that solder on said mounting pad does not run toward said via when said solder is melted.

7. The multi-layer printed wiring board of claim 6 further including in combination an electrical component having one of its leads connected to said mounting pad by being attached to said solder on said mounting pad.

8. The multi-layer printed wiring board of claim 6 wherein said third layer of said multi-layer printed wiring board has pads and conductors on the upper and lower surfaces thereof and said second via does not extend thereto.

* * * * *